United States Patent
Matsuura et al.

(10) Patent No.: US 8,003,218 B2
(45) Date of Patent: *Aug. 23, 2011

(54) AL-NI-B ALLOY MATERIAL FOR REFLECTIVE FILM

(75) Inventors: Yoshinori Matsuura, Ageo (JP); Ryoma Tsukuda, Ageo (JP); Hironari Urabe, Ageo (JP); Takashi Kubota, Ageo (JP)

(73) Assignee: Mitsui Mining & Smelting Co., Ltd, Tokyo (JP)

( * ) Notice: Subject to any disclaimer, the term of this patent is extended or adjusted under 35 U.S.C. 154(b) by 469 days.

This patent is subject to a terminal disclaimer.

(21) Appl. No.: 12/093,478

(22) PCT Filed: Aug. 30, 2007

(86) PCT No.: PCT/JP2007/066837
§ 371 (c)(1),
(2), (4) Date: May 13, 2008

(87) PCT Pub. No.: WO2008/047511
PCT Pub. Date: Apr. 24, 2008

(65) Prior Publication Data
US 2009/0230416 A1 Sep. 17, 2009

(30) Foreign Application Priority Data
Oct. 16, 2006 (JP) ................. P2006-282049

(51) Int. Cl.
*B32B 15/00* (2006.01)
*H01L 33/00* (2010.01)
*C22C 21/00* (2006.01)
*C23C 14/34* (2006.01)

(52) U.S. Cl. ........ 428/432; 428/650; 428/632; 420/550; 257/98; 257/E33.067; 204/298.13

(58) Field of Classification Search .............. None
See application file for complete search history.

(56) References Cited

U.S. PATENT DOCUMENTS

| | | | |
|---|---|---|---|
| 6,329,275 B1 | 12/2001 | Ishigami et al. | 438/584 |
| 7,098,539 B2 | 8/2006 | Gotoh et al. | 257/765 |
| 2004/0022664 A1 | 2/2004 | Kubota et al. | 420/550 |
| 2004/0126608 A1* | 7/2004 | Gotoh et al. | 428/544 |

(Continued)

FOREIGN PATENT DOCUMENTS

JP 04333566 * 11/1992

(Continued)

OTHER PUBLICATIONS

Translation of JP-07-224304.*

(Continued)

*Primary Examiner* — Ling Xu
(74) *Attorney, Agent, or Firm* — Roberts & Roberts, LLP

(57) ABSTRACT

With respect to a reflection-type display device, an Al-based alloy material for a reflective film, which has excellent reflective characteristics and can be directly bonded to a transparent electrode layer such as ITO and IZO is provided. The present invention is Al—Ni—B alloy material for a reflective film, comprising aluminum containing nickel and boron, wherein a nickel content is 1.5-4 at %, a boron content is 0.1-0.5 at %, and the balance is aluminum. It is more preferable if the nickel content is 1.5-3 at %, and the boron content is 0.1-0.4 at %.

16 Claims, 1 Drawing Sheet

U.S. PATENT DOCUMENTS

2008/0073793 A1   3/2008   Urabe et al. .................. 257/765

FOREIGN PATENT DOCUMENTS

| JP | 3302894 | 6/1998 |
| JP | 2000-294556 | 10/2000 |
| JP | 2001-53024 | 2/2001 |
| JP | 2003-89864 | 3/2003 |
| JP | 2004-214606 | 7/2004 |
| JP | 2006-330662 | 12/2006 |
| JP | 2007-142356 | 6/2007 |
| WO | WO 97/13885 | 4/1997 |
| WO | WO 2006/117884 | 11/2006 |
| WO | WO 2006/117954 | 11/2006 |

OTHER PUBLICATIONS

Translation of JP-04-333566.*

* cited by examiner

AL-NI-B ALLOY MATERIAL FOR REFLECTIVE FILM

TECHNICAL FIELD

The present invention relates to an Al-based alloy material used for a display device, such as a liquid crystal display, and particularly to an Al—Ni—B alloy material for forming a reflective film suitable for a liquid crystal display of a reflection type.

BACKGROUND ART

In a display device such as a thin television represented by a liquid crystal display, a reflection type and a transmission type are known. Conventionally, a film of pure aluminum having a high reflectance has been adopted as a reflection-type display device. However, if this pure aluminum is used as a reflective film, in a case where the reflective film is bonded to a transparent electrode such as ITO (Indium Tin Oxide) and IZO (Indium Zinc Oxide) (hereinafter occasionally referred to as transparent electrode layer), an electrolytic corrosion phenomenon is caused due to an electrical chemical reaction when the patterning of the reflective film is carried out. This causes a formation of a circuit fulfilling a practical characteristics to be difficult.

For this reason, Ag or Ag-based alloy which has a high reflectance and is resistant to an electrical chemical corrosion was adopted as material for the reflective film, instead of pure aluminum (Patent Publication 1). However, it was pointed out that it is difficult to form a desired circuit due to an influence of its etching characteristics if aluminum base alloy is used as reflective film material, so that the productivity tends to become inferior.

Such being the case, aluminum base alloy which restrains such an electrolytic corrosion phenomenon upon the patterning was proposed (Patent Publication 2). However, as to the film formed with the aluminum base alloy disclosed in this publication, neither the reflectance characteristics nor the electrical characteristics upon bonding has not been cleared yet. In addition, although Al-based material which attains the direct bonding thereof to the transparent electrode layer such as ITO was proposed (Patent Publications 3 and 4), the reflectance characteristics of the film formed with the aluminum base material disclosed in these publications has not been studied, so that whether or not it is provided with a practical reflectance characteristics has not been cleared yet.

Patent Publication 1: Japanese Patent No. 3302894
Patent Publication 2: International Publication WO97/13885
Patent Publication 3: Japanese Patent Laid-open Publication 2003-89864
Patent Publication 4: Japanese Patent Laid-open Publication 2004-214606

DISCLOSURE OF THE INVENTION

Problems to be Solved by the Invention

The present invention was made against a background of the above circumstances, and thus the object of the present invention is to provide Al-based alloy material for a reflective film used in a display device of a reflection type which has an excellent reflective characteristics and is capable of being directly bonded to a transparent electrode layer such as ITO and IZO.

Means for Solving the Problems

The present invention is an Al—Ni—B alloy material for a reflective film made of aluminum, which contains nickel and boron, wherein the nickel content is 1.5-4 at %, the boron content is 0.1-0.5 at %, and the balance is aluminum.

It is preferred that the nickel content is 1.5-3 at %, and the boron content is 0.1-0.4 at %.

The present invention is an element structure of a display device of a reflection type comprising a reflective film layer made of the Al—Ni—B alloy material, and a transparent electrode layer, wherein the reflective film layer includes a portion directly bonded to a semiconductor layer.

In a case where the reflective film is formed with the Al—Ni—B alloy material of the present invention, it is preferred that a sputtering target containing the nickel content of 1.5-4 at %, the boron content of 0.1-0.5 at %, and the balance of aluminum be used.

BEST MODE FOR CARRYING OUT THE INVENTION

Figure 1:
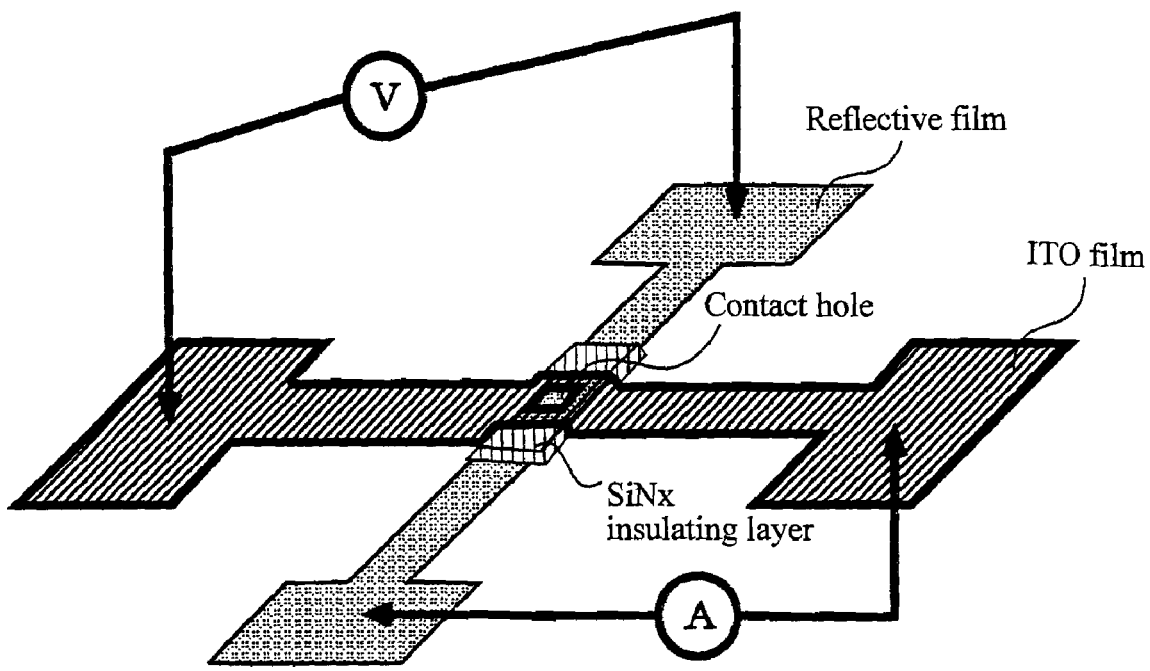
FIG. 1 is a schematic perspective view showing a test sample consisting of an ITO film and a reflective film which are laminated in an intersected manner.

Although the best mode for carrying out the present invention will be described below, the present invention is not limited to the following embodiments.

After making a keen study of an Al—Ni based alloy, the present inventors discovered Al—Ni-A alloy material for a reflective film which preferably includes an excellent reflective characteristics, while an electrolytic corrosion phenomenon upon the patterning can be restrained by adding a predetermined amount of boron (B) to Al—Ni based alloy.

More specifically, it is an Al—Ni—B alloy material for a reflective film which includes Ni content of 1.5 at % to 4 at %, boron content of 0.1 at % to 0.5 at %, and the balance being aluminum. The reflective film formed with the Al—Ni—B alloy material for a reflective film including the above composition has a reflectance of equal to or higher than 87% after it is annealed at 250° C. and the low resistance characteristics of equal to or lower than 4.5 µΩ·cm, whereby no plastic deformation such as hillocks (projections) or dimples (depressed defects) can be caused on the reflective film itself. In addition, the reflective film including such a composition can restrain the electrolytic corrosion phenomenon when the reflective film layer is directly bonded to the transparent electrode layer. In this connection, "the Al—Ni—B alloy material for a reflective film" in the present invention does not exclude the invasion of unavoidable impurities such as gas ingredient which can be invaded during the material manufacturing process, or the wire circuit forming process, or the element manufacturing process. Further, the term "Al—Ni—B alloy material for a reflective film" is used in this application to cover the reflective film itself, its material, for instance, the sputtering target for forming the reflective film, or the sputtering film formed by the sputtering target.

If nickel content is lower than 1.5 at %, the heat resistance of the reflective film cannot be maintained. In addition, if nickel content is lower than 0.5 at %, the characteristics concerning the direct bonding of the reflective film to the transparent electrode film such as ITO tends to worsen. If nickel content exceeds 4 at %, the resistivity of the reflective film tends to exceed 4.5 µΩ·cm. In addition, if boron content is lower than 0.1 at %, the heat resistance of the reflective film cannot be maintained. if boron content exceeds 0.5 at %, the reflectance becomes lower than 87.0%. In the present invention, a heat resistance is defined in such a way that no plastic deformation such as hillocks (projections) or dimples (depressed defects) is caused on the reflective film while it undergoes heat treatment at 250° C. for 30 minutes.

In the present invention, a reflectance is defined to be an absolute reflectance calculated from a light intensity of the light reflected on the reflective film when the light with the wavelength of 550 nm is hit on the reflective film. The reflectance is measured using the reflective film which underwent heat treatment at 250° C. for 30 minutes.

Further, within the above range of the composition, if nickel content is 1.5 at % to 3 at %, boron content is 0.1 at % to 0.4 at %, the reflective film with the reflectance being higher than 88% and the resistivity being equal to or lower than 4.0 μΩ·cm be attained.

The reflective film layer formed with the above Al—Ni—B alloy material for a reflective film can be directly bonded to the transparent electrode layer, and has a desired reflective characteristics.

In a case where the reflective film is formed with the Al—Ni—B alloy material of the present invention, it is preferable that a sputtering target include nickel content of 1.5 at % to 4 at %, boron content of 0.1 at % to 0.5 at %, and the balance being aluminum. When the sputtering target with such a composition is used, the reflective film whose composition is almost the same as that of the target can be readily formed, although it more or less depends on the conditions on which the film is formed upon the sputtering.

Although the Al—Ni—B alloy material according to the present invention is desirably deposited by sputtering as described above from a practical point of view, other different methods may be employed. For example, a dry process, such as an evaporation method and spray forming method, may be used. Examples of the dry process includes using alloy particles having the Al—Ni—B alloy composition according to the present invention as the wiring material in an aerosol deposition or ink jet method to form a reflective film.

EMBODIMENTS

An embodiment will be described below. In this embodiment, an Al—Ni—B alloy material having each composition shown in Table 1 was used to form a reflective film and the characteristics of the film were evaluated. The evaluated characteristic of each film was resistivity, heat resistance of the film, reflectance, and ITO bondability. The measurement conditions of each characteristics evaluation will be described below.

Resistivity of film: Sputtering targets having each composition listed in Table 1 were manufactured, and then a reflective film (about 0.3μm thick) was formed on a glass substrate with a magnetron sputtering equipment (the sputtering condition of an input power DC of 3.0 Watt/cm$^2$, an argon gas flow rate of 100 sccm, an argon gas pressure of 0.5 Pa). Then, the reflective film was measured using a four-terminal resistance measuring apparatus after performing heat treatment at 300° C. for 30 minutes in an atmosphere of nitrogen gas. In this connection, the sputtering targets used in this embodiment were manufactured by mixing the metals in respective compositions described in Table 1 with aluminum, melting and stirring the mixture in a vacuum, casting in an inactive gas atmosphere, rolling and forming the resultant ingot, and processing the surface to be used in sputtering into a flat surface.

Heat resistance: The heat resistance of the reflective film having each composition described in Table 1 was determined by observing the film surface under a scanning electron microscope (SEM:10,000×) after forming the single film (about 0.3 μm thick) on a glass substrate through sputtering (under the same condition as that described above) and performing heat treatment at every 50° C. from 100° C. to 400° C. (for 30 minutes in an atmosphere of nitrogen gas. In the SEM observation, five fields of view in each observed sample were checked, each field of view having a size of 10 μm by 8 μm. With respect to the evaluation results of the heat resistance shown in Table 1, the heat treatment temperature at which a sample that was determined to have projections (hillocks) with a diameter of 0.1 μm or larger on the observed surface, or at which a sample that was determined to have four or more dished dimples (0.3 μm to 0.5 μm in diameter) on the observed surface was evaluated as a heat resistance evaluation temperature.

Reflectance: The reflectance was measured by an ultraviolet visible spectrophotometer (V550-DS: JASCO Corporation). The reflectance measured with this meter is an absolute reflectance and the reflectance for a deposited pure aluminum film was measured as a reference. Although the measuring range is a visible light range (250 nm-850 nm), the measuring value based on the light with the wavelength of 550 nm was adopted as the reflectance in this embodiment. The light was introduced at the incidence angle of 5 degrees from a light source to a reflective film of a glass substrate disposed in an atmosphere, and then the reflectance was measured with the reflected light at the reflection angle of 5 degrees. The conditions for manufacturing each reflective film were the same as those described with respect to the resistivity of film. The reflectance was measured using the reflective film which underwent heat treatment at 250° C. for 30 minutes.

ITO bondability: The ITO bondability was evaluated with the use of a test sample (Kelvin element) obtained such that an ITO ($IN_2O_3$-10 wt % $SnO_2$) film (having a thickness of 1000 Å and a circuit width of 10 μm) was formed on a glass substrate, as shown in the schematic perspective view of FIG. 1, and a reflective film having each composition (having a thickness of 2000 Å and a circuit width of 10 μm) was formed on the ITO electrode film such that the reflective film layer intersected the ITO film.

In manufacturing the test sample, firstly, a sputtering target having each composition listed in Table 1 was used to form a reflective film having a thickness of 2000 Å on the glass substrate under the sputtering condition described above. Then, a resist (OFPR800:TOKYO OHKA KOGYO CO., LTD.) was coated on each reflective film surface having each composition, and a pattern film for forming a 10 μm-width circuit was placed on the resist, followed by exposure to light and development with an alkali developing solution containing tetramethylammonium hydroxide (hereinafter abbreviated as TMAH developing solution) having a concentration of 2.38% and a solution temperature of 23° C. Upon development, phosphoric acid-based mixed acid etching solution (KANTO CHEMICAL CO., INC.) was used to form the circuit. Then, dimethyl sulfoxide (hereinafter abbreviated as DMSO) stripping solution was used to remove the resist so as to form the 10 μm-width circuit.

Thereafter, the substrate on which the 10 μm-width reflective film circuit was formed underwent pure water cleaning and drying, and a SiNx insulating layer (4200 Å in thickness) was formed on the surface of the substrate. The deposition of this insulating layer was performed by using a sputtering apparatus under the sputtering condition of an input power RF of 3.0 Watt/cm$^2$, an argon gas flow rate of 90 sccm, a nitrogen gas flow rate of 10 sccm, a pressure of 0.5 Pa and a substrate temperature of 300° C.

Then, a positive resist (TFR-970:TOKYO OHKA KOGYO CO., LTD) was coated on the surface of the insulating layer, and a pattern film for forming a 10 μm by 10 μm square contact hole was placed on the positive resist, followed by exposure to light and development using the TMAH developing solution. Then, $CF_4$ dry etching gas was used to form the contact hole. The contact was formed under the condition of a $CF_4$ gas flow rate of 50 sccm, an oxygen gas flow rate of 5 sccm, a pressure of 4.0 Pa and an output of 150 W.

Consequently, the DMSO stripping solution described above was used to strip the resist. Then, isopropyl alcohol was used to remove the residual stripping solution, followed by water cleaning and drying. On each sample that underwent the resist stripping process, an ITO sputtering target (having a composition of $In_2O_3$-10 wt % $SnO_2$) was used to form an ITO transparent electrode layer in the contact hole and therearound. The formation of the transparent electrode layer was performed by sputtering (a substrate temperature of 70° C., an input power of 1.8 Watt/cm² an argon gas flow rate of 80 sccm, an oxygen gas flow rate of 0.7 sccm and a pressure of 0.37 Pa), and then the 1000 Å-thick ITO film was formed.

A resist (OFPR800:TOKYO OHKA KOGYO CO., LTD.) was coated on the ITO film surface, and the pattern film was placed on the resist, followed by exposure to light, development with the TMAH developing solution and formation of the 10 μm-width circuit with an oxalic acid-based mixed acid etching solution (ITO05N: manufactured by KANTO CHEMICAL Co., Inc.). Upon the formation of the ITO film circuit, the DMSO stripping solution was used to remove the resist.

Each test sample obtained by using the preparation method described above underwent a heat treatment at 250° C. for 30 minutes in the atmosphere, and a current (3 mA) was consciously applied to the terminals of the test sample indicated by the arrows in FIG. 1 to measure the resistance. The resistance was measured at 85° C. in the atmosphere, which was the so-called accelerated life testing condition. Under this accelerated life testing condition, the period of time (failure time) taken for each test sample to show resistance 100 times or greater than the initial resistance at the start of the measurement was recorded. A test sample that did not fail after 250 hours under the accelerated life testing condition was evaluated as ◉. A test sample that failed within 250 hours under the accelerated life testing condition was evaluated as X. The accelerated life test described above is in accordance with the JIS C 5003:1974 and a reference document ("Efficient Way and Actual Practice of Reliablity Acceleration Tests", author and editor: Yoji Kanuma, J-TECHNO INC.).

TABLE 1

| No | Composition (at %) Ni | Composition (at %) B | Specific resistance (μΩ cm) | Thermal resistance (° C.) | Reflectance (%) | Evaluation | ITO bondability |
|---|---|---|---|---|---|---|---|
| A-1 | 0.5 | 0.1 | 3.5 | <250 | 90.6 | X | ○ |
| B-1 | 1.0 | 0.1 | 3.5 | <250 | 90.6 | X | ○ |
| B-2 |  | 0.2 | 3.6 | <250 | 88.8 | X | ○ |
| B-3 |  | 0.4 | 3.6 | <250 | 87.6 | X | ○ |
| C-1 | 1.5 | 0.1 | 3.8 | 250 | 90.5 | ◉ | ○ |
| C-2 |  | 0.4 | 3.6 | 250 | 88.8 | ◉ | ○ |
| C-3 |  | 0.5 | 3.8 | 250 | 87.2 | ○ | ○ |
| D-1 | 2.0 | 0.05 | 3.7 | <250 | 90.5 | X | ○ |
| D-2 |  | 0.1 | 3.9 | 250 | 90.4 | ◉ | ○ |
| D-3 |  | 0.2 | 3.7 | 250 | 89.5 | ◉ | ○ |
| D-4 |  | 0.3 | 3.8 | 250 | 89.0 | ◉ | ○ |
| D-5 |  | 0.4 | 3.7 | 250 | 88.4 | ◉ | ○ |
| D-6 |  | 0.5 | 3.9 | 250 | 87.0 | ○ | ○ |
| D-7 |  | 0.6 | 4.1 | 300 | 86.5 | X | ○ |
| E-1 | 2.5 | 0.1 | 4.0 | 250 | 89.2 | ◉ | ○ |
| E-2 |  | 0.2 | 4.0 | 250 | 88.4 | ◉ | ○ |
| E-3 |  | 0.3 | 3.9 | 250 | 88.2 | ◉ | ○ |
| E-4 |  | 0.4 | 4.0 | 250 | 88.0 | ◉ | ○ |
| F-1 | 3.0 | 0.1 | 3.9 | 250 | 89.2 | ◉ | ○ |
| F-2 |  | 0.2 | 3.7 | 300 | 88.5 | ◉ | ○ |
| F-3 |  | 0.3 | 3.8 | 300 | 88.5 | ◉ | ○ |
| F-4 |  | 0.4 | 4.0 | 350 | 88.3 | ◉ | ○ |
| F-5 |  | 0.45 | 4.2 | 350 | 87.4 | ○ | ○ |
| G-1 | 3.5 | 0.4 | 4.2 | 350 | 87.4 | ○ | ○ |
| H-1 | 4.0 | 0.05 | 3.9 | <250 | 87.3 | X | ○ |
| H-2 |  | 0.1 | 4.0 | 250 | 87.2 | ○ | ○ |
| H-3 |  | 0.2 | 4.1 | 300 | 87.1 | ○ | ○ |
| H-4 |  | 0.3 | 4.2 | 300 | 87.3 | ○ | ○ |
| H-5 |  | 0.4 | 4.5 | 350 | 87.1 | ○ | ○ |
| H-6 |  | 0.5 | 4.5 | 400 | 87.1 | ○ | ○ |
| H-7 |  | 0.6 | 4.7 | 400 | 86.4 | X | ○ |
| I-1 | 5.0 | 0.1 | 4.6 | 300 | 86.2 | X | ○ |
| I-2 |  | 0.4 | 4.8 | 400 | 85.7 | X | ○ |

As shown in Table 1, it was found that when nickel content and boron content are too low, the heat resistance of the reflective film tends to worsen, on the contrary, when Ni content and Boron content are too high, the reflectance of the reflective film tends to worsen as the specific film resistance is increased. In addition, in Table 1, when the reflectance is less than 87.0%, or the resistivity value is equal to or higher than 4.5 μΩcm, or the heat resistance is lower than 250° C., it was evaluated as x, and when the heat resistance is equal to or higher than 250° C., and the reflectance is equal to or higher than 87.0%, and the resistivity value is equal to or less than 4.5 μΩcm, it was evaluated as ○ and when the heat resistance is equal to or higher than 250° C., and the reflectance is equal to or higher than 88.0%, and the resistivity value is equal to or lower than 4.0 μΩcm, it was evaluated as ◉. From the evaluation results, it was found that when nickel content is 1.5 at % to 4.0 at % and boron content is 0.1 at % to 0.5 at %, the heat resistance is equal to or higher than 250° C., and the reflectance is equal to or higher than 87.0%, and the resistivity value is equal to or lower than 4.5 μΩcm. In addition, it was found that when nickel content is 1.5 at % to 3.0 at % and boron content is 0.1 at % to 0.4 at %, the heat resistance is equal to or higher than 250° C., and the reflectance is equal to or higher than 88.0%, and the resistivity value is equal to or lower than 4.0 μΩcm. In this connection, it was confirmed that the reflective film formed with an Al—Ni—B alloy material made of each composition listed in Table 1 can be directly bonded to ITO without causing any trouble.

INDUSTRIAL APPLICABILITY

The present invention can provide a reflective film which includes excellent reflective characteristics, while at the same time is capable of directly being bonded to a transparent electrode layer such as ITO or IZO. In addition, the reflective film formed with the Al—Ni—B alloy material for the reflective film of the present invention can maintain a high reflectance in a stable manner, even if a thermal history is applied to the reflective film.

The invention claimed is:

1. A reflective film comprising an Al—Ni—B alloy material, which Al—Ni—B alloy material comprises aluminum, nickel and boron, wherein the nickel content is 1.5-4 at %, the boron content is 0.1-0.5 at %, and the balance is aluminum, and wherein the reflective film has a reflectance of 87% or higher and a resistivity of 4.5 μΩcm or less.

2. The reflective film according to claim 1, wherein the nickel content is 1.5-3 at %, and the boron content is 0.1-0.4 at %.

3. An element structure of a reflection-type display device comprising a reflective film layer made of the Al—Ni—B alloy material which is defined in claim 2, and a transparent electrode layer, wherein the reflective film layer has a portion directly bonded to the transparent electrode layer.

4. The element structure of claim 3 wherein the transparent electrode layer comprises indium tin oxide or indium zinc oxide.

5. The element structure of claim 4 wherein the transparent electrode layer is formed on a glass substrate.

6. The element structure of claim 3 wherein the reflective film layer is formed on a glass substrate.

7. The element structure of claim 3 wherein the transparent electrode layer is formed on a glass substrate.

8. An element structure of a reflection-type display device comprising a reflective film layer defined in claim 1, and a transparent electrode layer, wherein the reflective film layer has a portion directly bonded to the transparent electrode layer.

9. The element structure of claim 8 wherein the transparent electrode layer comprises indium tin oxide or indium zinc oxide.

10. The element structure of claim 8 wherein the reflective film layer is formed on a glass substrate.

11. The element structure of claim 10 wherein the transparent electrode layer is formed on a glass substrate.

12. The element structure of claim 8 wherein an insulating layer is formed on a surface of the glass substrate.

13. The element structure of claim 8 wherein the transparent electrode layer is formed on a glass substrate.

14. The element structure of claim 8 wherein the transparent electrode layer is formed on a glass substrate by sputtering.

15. A sputtering target having a reflective film formed thereon, which reflective film comprises an Al—Ni—B alloy material comprising aluminum, nickel, and boron, wherein the nickel content is 1.5-4 at %, the boron content is 0.1-0.5 at %, and the balance is aluminum, and wherein the reflective film has a reflectance of 87% or higher and a resistivity of 4.5 μΩcm or less.

16. The sputtering target of claim 15 wherein the nickel content is 1.5-3 at %, and the boron content is 0.1-0.4 at %.

* * * * *